(12) United States Patent
Brunel et al.

(10) Patent No.: US 8,841,740 B2
(45) Date of Patent: Sep. 23, 2014

(54) SINGLE-PHOTON AVALANCHE DIODE ASSEMBLY

(71) Applicant: STMicroelectronics (Grenoble 2) SAS, Grenoble (FR)

(72) Inventors: John Brunel, Grenoble (FR); Andrew Holmes, Edinburgh (GB)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 12 days.

(21) Appl. No.: 13/706,505

(22) Filed: Dec. 6, 2012

(65) Prior Publication Data

US 2013/0154044 A1    Jun. 20, 2013

(30) Foreign Application Priority Data

Dec. 16, 2011 (FR) .................................... 11 61782

(51) Int. Cl.
*H01L 31/107* (2006.01)
*H01L 31/09* (2006.01)

(52) U.S. Cl.
CPC ..................................... *H01L 31/09* (2013.01)
USPC ................................... 257/438; 257/E29.335

(58) Field of Classification Search
USPC .................. 257/199, 233, 481, 603, E21.063, 257/E29.327, E29.335, E21.053, E21.352, 257/E21.355, E21.357, E21.366

See application file for complete search history.

(56) References Cited

U.S. PATENT DOCUMENTS

| 5,276,350 | A | * | 1/1994 | Merrill et al. | ................. 257/603 |
| 6,384,663 | B2 | * | 5/2002 | Cova et al. | ..................... 327/514 |
| 2006/0192086 | A1 | * | 8/2006 | Niclass et al. | ............. 250/214.1 |
| 2006/0238037 | A1 | * | 10/2006 | Oh et al. | ........................ 307/409 |
| 2010/0321092 | A1 | * | 12/2010 | Momota et al. | ................ 327/512 |

* cited by examiner

*Primary Examiner* — Selim Ahmed
(74) *Attorney, Agent, or Firm* — The Noblitt Group, PLLC

(57) ABSTRACT

A single-photon avalanche diode assembly, the diode including a central terminal and a peripheral terminal, the peripheral terminal being connected to an input of a comparator and to a first power supply terminal by a first resistor, the central terminal being connected by a conductive track to a second power supply terminal, a second resistor being arranged in series on said conductive track.

5 Claims, 3 Drawing Sheets

SINGLE-PHOTON AVALANCHE DIODE ASSEMBLY

BACKGROUND OF THE INVENTION

1. Field of the Invention

The present invention relates to photodiodes reverse-biased to a voltage slightly greater than their avalanche threshold. Such photodiodes thus operate in so-called Geiger mode and enable to detect radiations of very low light intensity. Such photodiodes are commonly called SPADs ("Single Photon Avalanche Diodes") and are especially used for the detection of single photons and the counting of photons.

2. Discussion of Prior Art

FIG. 1 is a cross-section view schematically showing a simplified example of a structure of a photodiode intended to operate in avalanche and that can be used for the detection of single photons. The photodiode is intended to be illuminated on its upper surface 2.

In the upper P-type portion of a semiconductor substrate 1, an N-type ring 3 extending from the upper surface of the substrate surrounds a P-type well 5. An N-type buried layer 7 extends under P-type well 5. The P-N junction causing the avalanche phenomenon corresponds to junction 8 between P-type well 5 and N-type buried layer 7.

A P-type region 9, more heavily doped than well 5, is formed at the center of well 5 and corresponds to the anode contact of the photodiode.

N-type regions 11, more heavily doped than ring 3, extend in ring 3 from the upper surface of the substrate. Regions 11 are for example distributed in ring 3 at regular intervals and correspond to the cathode contact of the photodiode.

FIG. 2 shows a conventional characteristic I(V) 13 of the current versus the voltage of a diode.

For an operation as a single-photon detector, the photodiode is reverse-biased to a voltage $V_{pol}$ slightly greater than avalanche threshold $V_a$ of the photodiode. Call $V_e$ the voltage difference between bias voltage $V_{pol}$ and avalanche threshold $V_a$. The operating point of the photodiode when it absorbs no photons corresponds to point 14 of characteristic I(V) 13. Current $I_1$ crossing the photodiode is almost non-existent.

As soon as a photon is absorbed by the photodiode, the electron of the generated electron-hole pair triggers an avalanche phenomenon which makes the photodiode transit from operating point 14 to operating point 15 (current $I_2$) of characteristic I(V) 13. Current pulse $I_2$ is greater than current $I_1$ by several orders of magnitude.

FIG. 3 is an equivalent electric diagram of an example of a detection circuit comprising a photodiode 21 such as that illustrated in FIG. 1 and enabling to detect single photons.

Anode 9 of photodiode 21 is connected to a power supply terminal 25 at voltage $-V_a$. Cathode 11 of photodiode 21 is connected, via a resistor $R_q$, called quenching resistor, to a power supply terminal 27 at voltage $V_e$. A comparator 29 is also connected to cathode 11 of photodiode 21.

The single-photon detection circuit illustrated in FIG. 3 operates as follows.

As soon as no photon is absorbed by photodiode 21 reverse-biased to voltage $V_{pol}=V_a+V_e$ slightly greater than the avalanche threshold, current $I_1$ running through the photodiode is very low. The voltage at node E is almost equal to $V_e$ and the output of comparator 29 is at a low level.

When a photon is absorbed by the photodiode, it triggers an avalanche phenomenon. The current crossing photodiode 21 increases rapidly. A voltage drop appears across resistor $R_q$ and the voltage of node E drops. The output of comparator 29 then switches from the low level to the high level. Resistor $R_q$ further enables to quench the avalanche phenomenon triggered by this photon to be able to detect the absorption of another photon.

FIG. 4 is a top view of an example of an integrated embodiment of an avalanche photodiode assembly enabling to detect single photons, comparator 29 being shown in the form of an electric symbol. The elements of FIG. 4 common with those of FIGS. 1 and 3 are designated with the same reference numerals.

Only the metallizations of a photodiode 21 are shown in FIG. 4. A metallization 31 forms a contact on anode 9 of the photodiode, and a metallization 33 forms a contact on cathode 11 of the photodiode.

Anode 31 of the photodiode is connected to a conductive track 35. A portion 37 of conductive track 35 is located above the photodiode. Conductive track 35 is connected to another photodiode, not shown, by a conductive track 36. A conductive track 39 connects cathode 33 of the photodiode to resistor $R_q$, and to comparator 29.

To mask the photodiode as little as possible, portion 37 of anode conductive track 35 is as narrow as possible.

Conductive track 35 normally does not conduct high currents, even during avalanches, since resistor $R_q$, limits the current. The decreased width of portion 37 of this conductive track thus apparently raises no issue.

SUMMARY OF THE INVENTION

However, the applicant has observed unexpected destructions of photodiodes of the type illustrated in FIG. 4 and, more specifically, destructions of the narrowest portion 37 of conductive track 35.

There thus is a need for an avalanche photodiode assembly for the detection of single photons protected against risks of destruction of the conductive track connected to the central terminal of the photodiode.

Thus, an embodiment provides a single-photon detection avalanche diode assembly, the diode comprising a central terminal and a peripheral terminal, the peripheral terminal being connected to an input of a comparator and to a first power supply terminal by a first resistor, the central terminal being connected by a conductive track to a second power supply terminal, a second resistor being arranged in series on said conductive track.

According to an embodiment, the diode is formed in the upper portion of a first conductivity type of a semiconductor substrate, comprising: a well of the first conductivity type; a ring of the second conductivity type surrounding the well; and a buried layer of the second conductivity type extending under the well; the central terminal of the diode comprises a region of the first conductivity type extending at the center of the well and more heavily doped than the well; and the peripheral terminal of the diode comprises regions of the second conductivity type extending in the ring and more heavily doped than the ring.

According to an embodiment, the first resistor is embodied by a MOS transistor.

According to an embodiment, the comparator is embodied by an inverter.

According to an embodiment, the conductive track comprises a portion, located at least partly above the diode, having a width smaller than 1 μm and a thickness smaller than 5 μm.

According to an embodiment, the first and second resistors have respective values ranging from 500 ohms to 100 kiloohms and from 10 to 100 ohms.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

Figure 4:
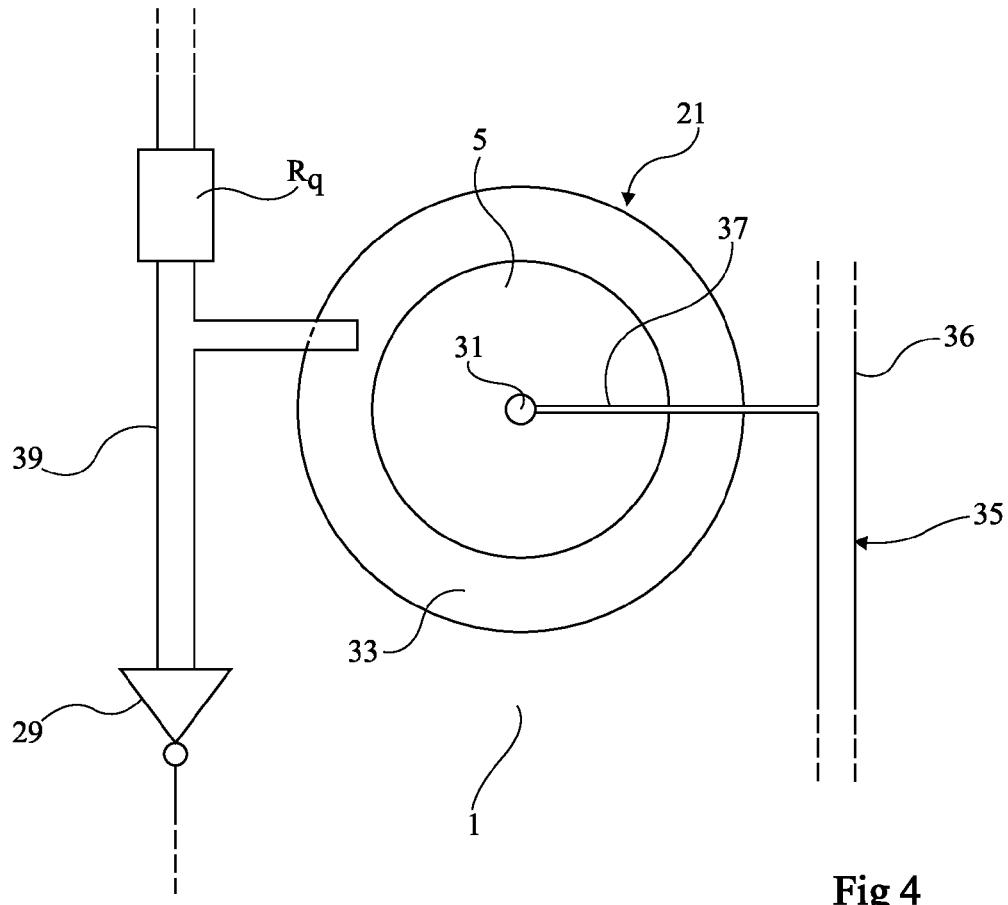
FIG. 4, previously described, is a top view of an integrated embodiment of a single-photon avalanche diode assembly.

Despite the presence of quenching resistor $R_q$ which limits the current, the applicant has observed destructions of photodiodes of the type illustrated in FIG. 4, and more specifically destructions of the narrowest portion 37 of conductive track 35 connected to the central anode of the photodiode.

The present inventors impute this problem to the existence of parasitic components which create current flow paths on occurrence of incidental overvoltages. The present inventors provide a single-photon avalanche diode assembly enabling to avoid such destructions.

Figure 1:
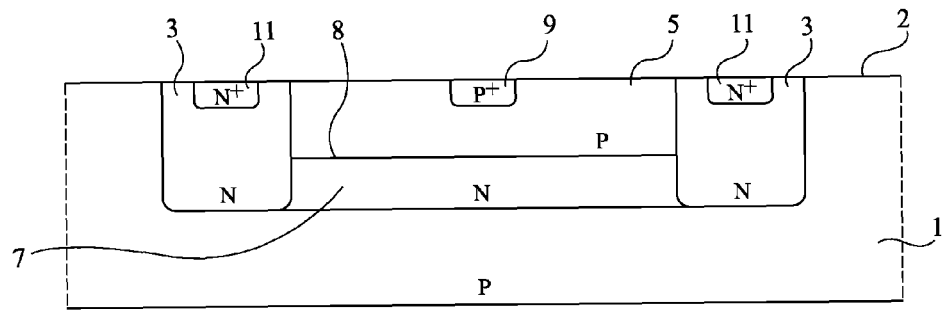
FIG. 1, previously described, is a cross-section view schematically illustrating a photodiode capable of being used in avalanche for the detection of single photons.
Figure 2:
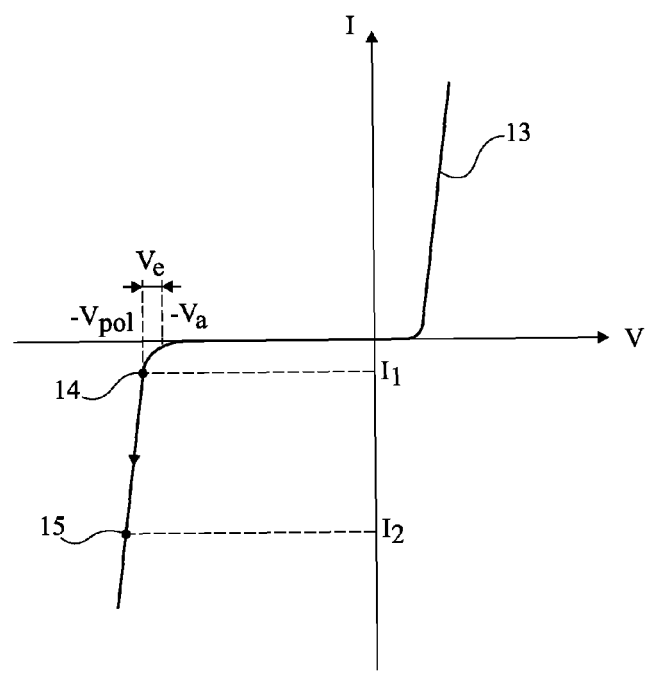
FIG. 2, previously described, illustrates a usual characteristic of the current versus the voltage of a diode.
Figure 3:
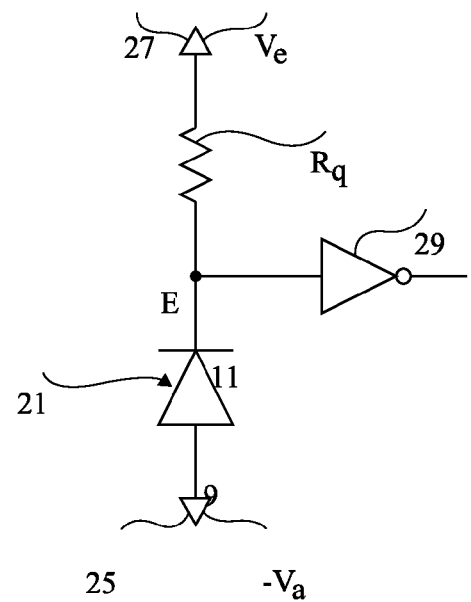
FIG. 3, previously described, is an equivalent electric diagram of a circuit for detecting single photons using a photodiode such as that illustrated in FIG. 1.
Figure 5:
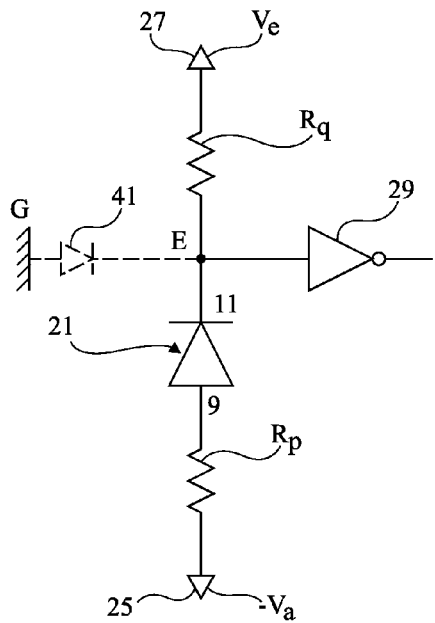
FIG. 5 is an equivalent electric diagram of a circuit for detecting single photons using a photodiode such as that illustrated in FIG. 1, protected against overvoltages.

FIG. 5 is an equivalent electric diagram of a circuit for detecting single photons using a photodiode such as that illustrated in FIG. 1.

There is a parasitic diode 41 between the cathode of photodiode 21 and a substrate bias terminal, generally connected to ground G. Parasitic diode 41, called bulk diode, corresponds to the P-N junction between P-type substrate 1 and N-type buried layer 7. The anode contact of parasitic bulk diode 41 corresponds to a substrate bias contact, not shown in FIG. 1. The cathode contact of parasitic bulk diode 41 corresponds to regions 11.

Incidental overvoltages may occur on one of the circuit terminals (25, 27, G). If a positive overvoltage occurs between terminals 25 and G, this overvoltage induces a current which flows through conductive track 35, forward-biased photodiode 21, and parasitic substrate diode 41 (in avalanche), towards terminal G. If a positive overvoltage occurs between terminals G and 25, this overvoltage induces a current which flows through forward-biased parasitic bulk diode 41, photodiode 21 in avalanche, and conductive track 35, towards terminal 25. In both cases, the current may be high and destructive for the narrowest portion 37 of conductive track 35.

Once this problem has been identified, the present inventors provide inserting an additional protection resistor, $R_p$, in series on conductive track 35 connecting central anode 9 of the photodiode to power supply terminal 25.

To avoid affecting the operation of the single-photon detection circuit illustrated in FIG. 5, resistor $R_p$ is selected to be low with respect to resistor $R_q$. Protection resistance $R_p$ is at least 10 times smaller than quenching resistance $R_q$, for example, 100 times smaller.

As an example of order of magnitude, quenching resistance $R_q$ ranges between 500 ohms and 100 kilo-ohms, and for example is on the order of 5 kilo-ohms, and protection resistance $R_p$ ranges between 10 and 100 ohms and for example is on the order of 40 ohms.

Figure 6:
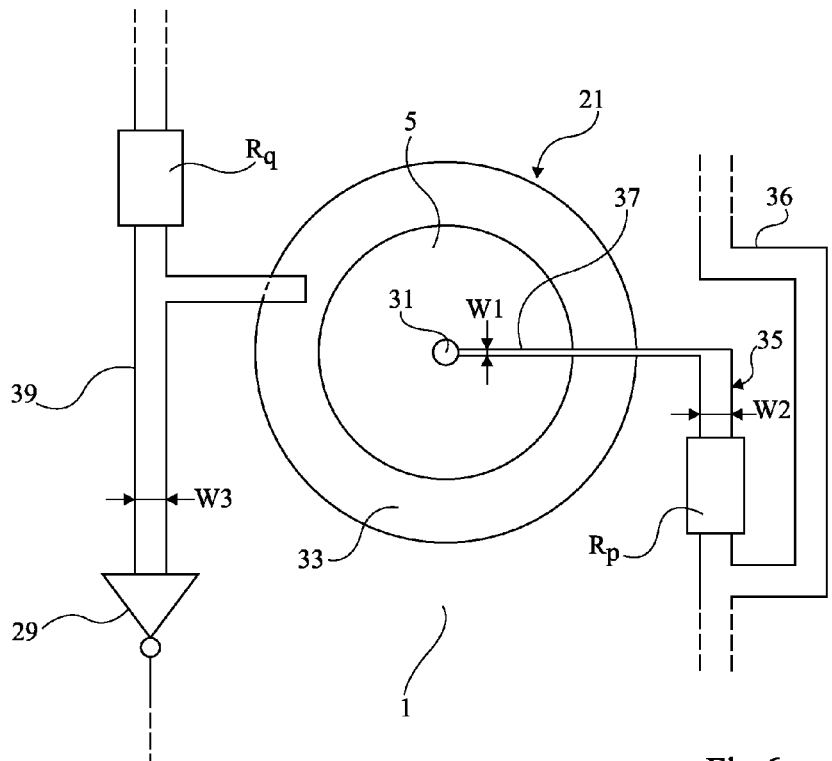
FIG. 6 is a top view of an example of integrated embodiment of a single-photon avalanche diode assembly protected against overvoltages.

FIG. 6 is a top view of an integrated embodiment of a single-photon avalanche diode assembly protected against overvoltages.

As an example of order of magnitude, width W1 of portion 37 ranges between 0.1 and 1 µm, while width W2 of the rest of conductive track 35 and width W3 of conductive track 39 range between 1 and 2 µm. The thickness of conductive tracks 35 and 39 and of portion 37 is for example smaller than 5 µm, for example, on the order of 2 µm.

A protection resistor $R_p$ is arranged in series on conductive track 35 connecting central anode 31 of the photodiode to a power supply terminal.

A conductive track 36 connects the central anode of another photodiode, not shown, to the power supply terminal. The two photodiodes are connected in parallel. Cathode 33 of the other photodiode is connected to an input of another comparator 29 and to another resistor $R_q$. A protection resistor $R_p$ is arranged in series on conductive track 36 connecting central anode 31 of the photodiode to the power supply terminal.

A quenching resistor $R_q$ being already provided in an avalanche photodiode assembly such as illustrated in FIG. 4, protection resistor $R_p$ may be formed at the same time as quenching resistor $R_q$, without adding any manufacturing step.

Specific embodiments of the present invention have been described. Variation alterations, modifications, and improvements will occur to those skilled in the art. In particular, a specific single-photon avalanche diode assembly has been described in relation with the various drawings. The resistor described herein as an element for quenching the avalanche phenomenon may be formed by any means, for example, by a MOS transistor assembled as a resistor. Other systems capable of quenching the avalanche phenomenon may be used, for example, active systems. Similarly, instead of a comparator, any other detection device capable of detecting a variation of the voltage at the node located between the cathode of the photodiode and the quenching resistor and of converting it into a digital signal such as, for example, an inverter, may be used.

Further, a single-photon avalanche diode assembly has been described in the case where the central terminal of the diode is its anode and the peripheral terminal of the diode is its cathode. Of course, all the conductivity types of a photodiode of the type illustrated in FIG. 1 may be inverted. The central terminal of the diode then is its cathode, and its peripheral terminal is its anode.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A single-photon avalanche diode assembly, comprising:
a diode comprising a central terminal and a peripheral terminal wherein:
   the peripheral terminal is connected to an input of a comparator and to a first power supply terminal by a first resistor;
   the central terminal is connected by a conductive track to a second power supply terminal, a second resistor being arranged in series on said conductive track between the central terminal and the second power supply terminal; and
   the diode is formed in an upper portion of a first conductivity type of a semiconductor substrate, the upper portion comprising:
      a well of the first conductivity type;
      a ring of a second conductivity type surrounding the well; and
      a buried layer of the second conductivity type extending under the well, wherein:
      the central terminal of the diode comprises a region of the first conductivity type at the center of the well and more heavily doped than the well; and
      the peripheral terminal of the diode comprises regions of the second conductivity type in the ring and more heavily doped than the ring.

2. The assembly of claim 1, wherein the first resistor is embodied by a MOS transistor.

3. The assembly of claim 1, wherein the comparator is embodied by an inverter.

4. The assembly of claim 1, wherein the conductive track comprises a portion located at least partly above the diode, having a width smaller than 1 μm. and a thickness smaller than 5 μm.

5. The assembly of claim 1, the first and second resistors having respective values within ranges from 500 ohms to 100 kilo-ohms and from 10 to 100 ohms.

* * * * *